United States Patent
Ceballos et al.

(10) Patent No.: US 8,604,861 B1
(45) Date of Patent: Dec. 10, 2013

(54) SYSTEM AND METHOD FOR A SWITCHED CAPACITOR CIRCUIT

(75) Inventors: Jose Luis Ceballos, Villach (AT); Christian Reindl, Villach (AT); Jonathan Paca, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/527,193

(22) Filed: Jun. 19, 2012

(51) Int. Cl.
*G06G 7/18* (2006.01)

(52) U.S. Cl.
USPC .......................................................... 327/337

(58) Field of Classification Search
USPC .......................................................... 327/337
See application file for complete search history.

(56) References Cited

U.S. PATENT DOCUMENTS 7,832,685 B2 * 11/2010 Haynes et al. ............. 244/118.1

OTHER PUBLICATIONS

Pertijs, M.A.P. et al., "Precision Temperature Sensors in CMOS Technology," Springer, XII, 5.4 Advanced Offset Cancellation Techniques, 2006, 2 pages.
Belloni, M., "A Micropower Chopper—CDS Operational Amplifier," IEEE Journal of Solid-State Circuits, vol. 45, No. 12, Dec. 2010, 9 pages.
Belloni, M., et al., "Low-Power Ripple-Free Chopper Amplifier with Correlated Double Sampling De-Chopping," IEEE, 2010, 4 pages.
Kajita, T., et al., "A Two-Chip Interface for a MEMS Accelerometer," IEEE Transactions on Instrumentation and Measurement, vol. 51, No. 4, Aug. 2002, 6 pages.
Fan, Q., et al., "A Capacitively Coupled Chopper Instrumentation Amplifier with a ±30V Common-Mode Range, 160 dB CMRR and 5μV Offset," ISSCC 2012, Session 21, Analog Techniques, 21.9, IEEE International Solid-State Circuits Conference, 2012, 3 pages.
Martin, K. et al., "A Differential Switched-Coupled Amplifier," IEEE Journal of Solid-State Circuits, vol. sc-22, No. 1, Feb. 1987, 3 pages.
Wang, L., et al., "A Sigma-Delta Modulator with a Novel Chopper Correlated Double Sampled Integrator," IEEE 2011, 4 pages.
Ying, Y., "Chopper Stabilized Amplifiers," Department of Electrical and Computer Engineering, University of Toronto, Term Paper, 930360680, Nov. 12, 2001, 17 pages.

* cited by examiner

*Primary Examiner* — Daniel Rojas
(74) *Attorney, Agent, or Firm* — Slater & Matsil, L.L.P.

(57) ABSTRACT

In an embodiment, a circuit includes a forward path circuit having an auto-zero switch coupled between an input of an amplifier and an output of the amplifier, a first chopping circuit having an input coupled to an input of the forward path circuit and an output coupled to the input of the amplifier, and a second chopping circuit having an input coupled to the output of the amplifier and an output coupled to an output of the forward path circuit. The circuit further includes a feedback circuit that has a feedback switch, a feedback capacitor including a first end coupled to an output of the amplifier, a third chopping circuit coupled between the input of the forward path circuit and a first end of a feedback switch, and a fourth chopping circuit coupled between a second end of the feedback switch and a second end of the feedback capacitor.

19 Claims, 4 Drawing Sheets

SYSTEM AND METHOD FOR A SWITCHED CAPACITOR CIRCUIT

TECHNICAL FIELD

This invention relates generally to semiconductor circuits and methods, and more particularly to a system and method for a switched capacitor circuit.

BACKGROUND

Analog-to-digital converters are pervasively used in many applications ranging from low frequency applications such as sensor interfaces to high frequency applications such as A/D converters used for wireline and wireless communication systems. One commonly used A/D architecture is an oversampled A/D converter that uses a sigma delta modulator. A sigma delta modulator is generally a feedback loop that includes one or more integrators in a forward path followed by a low-resolution quantizer, the output of which is subtracted from the input to form an error signal. The quantizer output, which can have as low as one bit of resolution, is then decimated using a digital decimator to produce a multi-bit output.

One of the well-known properties of the sigma-delta modulator is that the quantization noise of the modulator is shaped by the loop, which yields a vast improvement in the signal-to-noise ratio with respect to a Nyquist rate A/D converter with the same quantizer resolution. For example, in a PCM A/D converter, each doubling in frequency yields a 3 dB improvement in the SNR. In a sigma-delta converter, however, each doubling in frequency ideally improves the SNR of the A/D converter by approximately, (6 L+3) dB, where L is the order of the sigma-delta modulator. As such, sigma-delta modulators can provide SNRs of well over 100 dB for audio and low frequency applications.

One common way of implementing a sigma-delta A/D converter is by using a switched capacitor circuit. At its most basic level, switched capacitor circuits perform analog signal processing in the charge domain by sampling charge on capacitors. CMOS processes are particularly suited for such circuits. By using a combination of feedback amplifiers, switching devices and ratioed capacitors, various sampled analog transfer functions, including the integrator used for sigma-delta modulators may be accurately represented even in the presence of a high amount of absolute component value variation.

With respect to low frequency and DC applications, switched capacitor based sigma-delta A/D converters pose a few issues with respect to noise and offset. While the over-sampled nature of the sigma delta modulator reduces the effect of kT/C thermal noise of the switches by spreading this noise across a higher bandwidth, issues of low frequency flicker noise and offset still remain. Switched capacitor techniques such as correlated double sampling may be used to mitigate these effects; however, as effective resolution of the converter increases, second order effects begin to limit the effective resolution of the A/D converter.

SUMMARY OF THE INVENTION

In accordance with an embodiment, a circuit includes a forward path circuit that has an amplifier, an auto-zero switch coupled between an input of the amplifier and an output of the amplifier, a first chopping circuit having an input coupled to an input of the forward path circuit and an output coupled to the input of the amplifier, and a second chopping circuit having an input coupled to the output of the amplifier and an output coupled to an output of the forward path circuit. The circuit further includes a feedback circuit that has a feedback switch, a feedback capacitor including a first end coupled to an output of the amplifier, a third chopping circuit coupled between the input of the forward path circuit and a first end of the feedback switch, and a fourth chopping circuit coupled between a second end of the feedback switch and a second end of the feedback capacitor.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a switched capacitor integrator. Embodiments of the present invention are not limited to switched capacitor integrator, and may also be applied to other switched capacitor circuit structures, as well as other types of circuits.

In an embodiment of the present invention, an embodiment switched capacitor integrator structure addresses the issues of DC offset and low frequency noise by utilizing both a correlated double sampling technique and a chopper stabilized technique in order to reduce the effects of low-frequency noise and DC offset. In an embodiment of the present invention, an embodiment switched capacitor integrator uses an auto-zeroing amplifier in conjunction with cross-coupled switch capacitor input network that samples the offset and low frequency noise of the amplifier, and subtracts the sampled noise from the integrated signal. In addition, a first pair of chopping circuits is used to reduce the effect of asymmetric charge injection from auto zero circuits within the auto-zeroing amplifier, as well as a second pair of chopping circuits used to reduce the effect of asymmetric charge injection from switches in series with the feedback capacitor of the switch capacitor integrator.

Figure 1A:
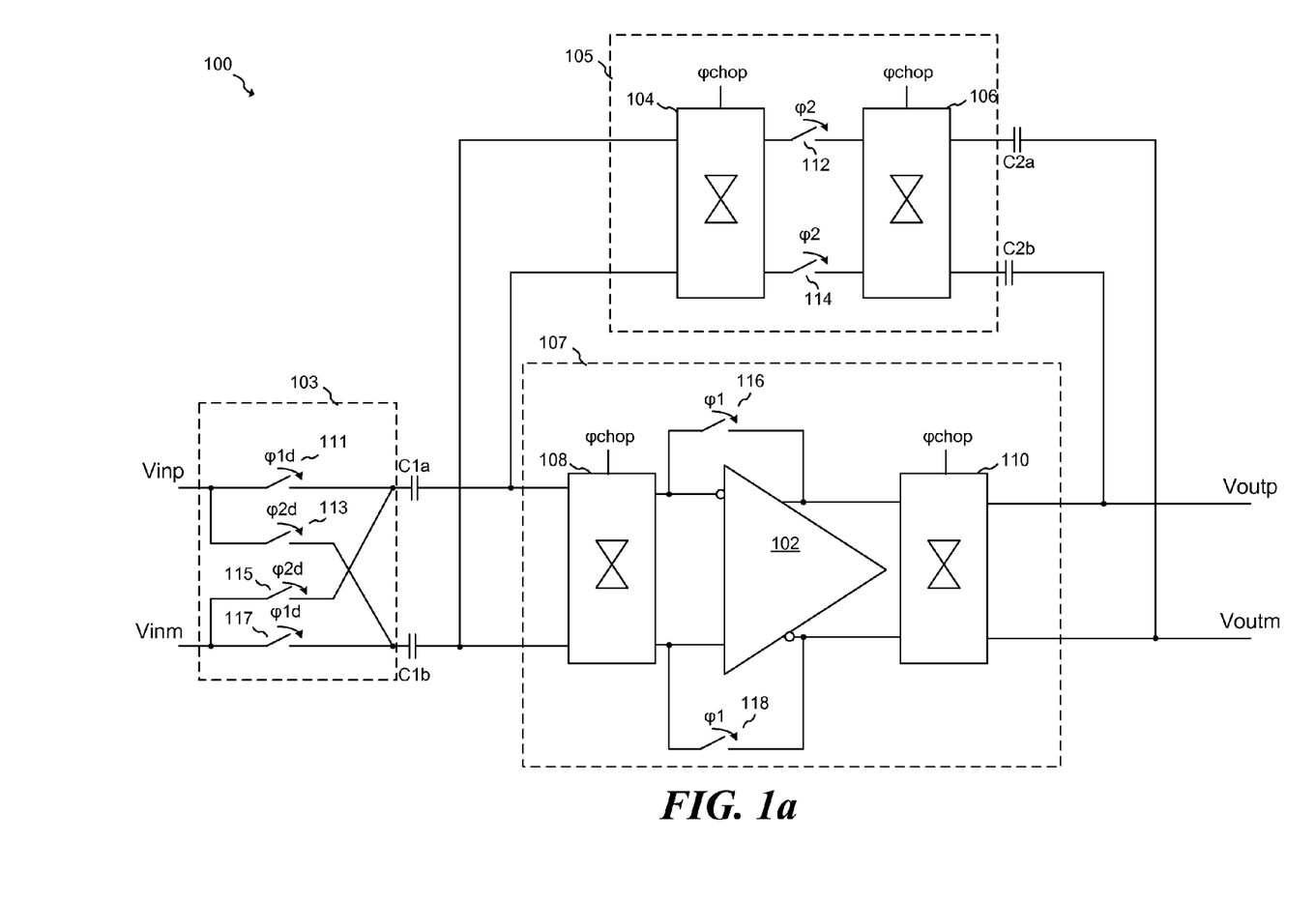
FIGS. 1a-c illustrate a switched capacitor integrator, its associated timing diagram, and a clock phase generator according to an embodiment of the present invention.

FIG. 1a illustrates switched capacitor integrator 100 in accordance with an embodiment of the present invention. Switched capacitor integrator 100 includes input switching network 103, series input capacitors C1a and C1b, chopper stabilized auto zeroing amplifier 107, chopper stabilized feedback network 105, and integration capacitors C2a and C2b.

In an embodiment, the integral of differential input (Vinp−Vinn) is produced at differential outputs (Voutp−Voutm). The transfer function of the differential output over the differential input is:

$$\frac{Vo}{Vin} = \frac{-2C1}{C2(z-1)}.$$

In an embodiment, input switching network 103 is made of switches 111, 113, 115, and 117. Switches 111 and 117, which form a non-inverting input path, are active when $\phi1d$ is asserted during a delayed first phase of operation, and switches 113 and 115 that form an inverting input path are active when $\phi2d$ is asserted during a delayed second phase of operation. In an alternative embodiment, switches 111 and 117, which form a non-inverting input path, are active when $\phi2d$ is asserted, and switches 113 and 115 are active when $\phi1d$ is asserted. In further alternative embodiments, other input switching structures may be used. In alternative embodiments, the left side of switches 113 & 115 may be disconnected from Vinp and Vinm and be reconnected together to an input common mode voltage.

Chopper stabilized auto zeroing amplifier 107 includes differential amplifier 102 coupled between chopping circuits 108 and 110. Auto-zeroing switches 116 and 118 coupled between inputs and outputs of amplifier 102 are activated during a first phase of operation when $\phi1$ is asserted. In an embodiment, amplifier 102 is implemented using a differential amplifier. In some embodiments, a fully differential amplifier with common mode feedback may be used. In an embodiment, the polarity of chopping circuits 108 and 110 is non-inverting during a chopping phase when $\phi$chop is asserted, and are inverting when $\phi$chop is not asserted. Alternatively, the polarity of chopping circuits 108 and 110 may be inverting during a chopping phase when $\phi$chop is asserted, and non-inverting when $\phi$chop is not asserted.

Chopper stabilized feedback network 105 includes feedback switches 112 and 113 coupled between chopping circuits 104 and 106. In an embodiment, the polarity of chopping circuits 104 and 106 is non-inverting during a chopping phase when $\phi$chop is asserted, and are inverting when $\phi$chop is not asserted. Alternatively, the polarity of chopping circuits 104 and 106 may be inverting during a chopping phase when $\phi$chop is asserted, and non-inverting when $\phi$chop is not asserted.

Figure 1B:
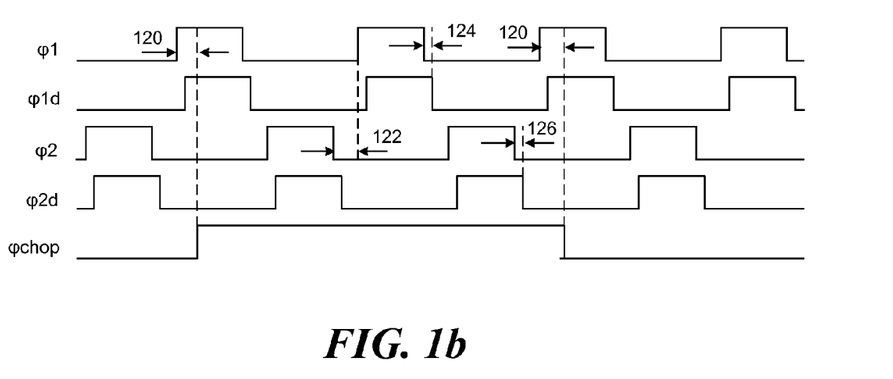

FIG. 1b illustrates an example timing diagram that may be used to operate switched capacitor integrator 100 of FIG. 1a. In an embodiment, phases $\phi1$ and $\phi2$ are non-overlapping clock phases, and phases $\phi1d$ and $\phi2d$ are delayed versions of non-overlapping clock phases $\phi1$ and $\phi2$. Phases $\phi1$ and $\phi2$ may be generated by a non-overlapping clock generator that provides a dead zone of time period 122. In an embodiment, this dead zone between assertions of $\phi1$ and $\phi2$ help ensure that not charge is lost during the transition between the assertions of phases $\phi1$ and $\phi2$.

In an embodiment, the delay between $\phi1$ and $\phi1d$ is designated by time period 124, and the delay between $\phi2$ and $\phi2d$ is designated by time period 126.

In an embodiment, chopping signal $\phi$chop is asserted and de-asserted during the time in which $\phi1$ is active. While FIG. 1b shoes that $\phi$chop is active for three consecutive cycles of $\phi1$ for convenience of illustration, it should be understood that $\phi$chop may be asserted for any number of consecutive cycles. In some embodiments, $\phi$chop operates with a 50% duty cycles in which $\phi$chop is asserted for a same number of consecutive cycles as it is de-asserted. When chopper 108 undergoes a change in state during this time, any charge injected is absorbed by the output of amplifier 102, which is coupled to its inputs via switches 116 and 118. Similarly, any change injection from chopper 110 will produce a negligible error since any injected charge from chopper 110 will also be absorbed by the output of amplifier 102. When chopper 104 undergoes a transition, any charge injected will also be absorbed by amplifier 102 via chopper 108 and switched 116 and 118. With respect to chopper 106, any error charge injected into capacitors C2a and C2b produce a negligible effect on offset since the frequency of $\phi$chop is much less than the frequency of $\phi1$ and $\phi2$. For example, in one embodiment, $\phi1$ and $\phi2$ operate at a frequency of about 50 KHz, while $\phi$chop operates at $\frac{1}{50}^{th}$ the frequency about 1 KHz. Alternatively, other sampling rates and ratios of the frequency of $\phi1$ and $\phi2$ to the frequency of $\phi$chop may be used.

Figure 1C:
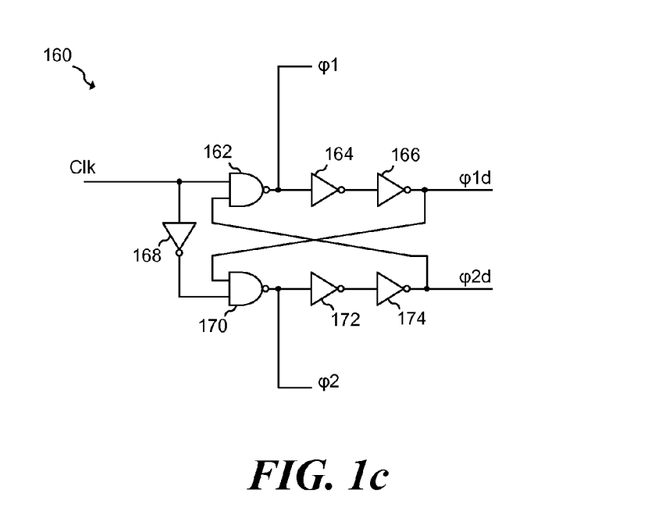

FIG. 1c illustrates non-overlapping clock generator 160 that may be used to produce clock phases of $\phi1$, $\phi1d$, $\phi2$, and $\phi2d$ based on clock signal Clk. In an embodiment, clock generator 160 has NAND gates 162 and 170 and inverters 164, 166, 172 and 174 arranged in a cross-coupled SR latch configuration. Inverter 160 provides an inverted clock for NAND gate 170. In an embodiment, phase $\phi1d$ is delayed from $\phi1$ by the delay of inverters 164 and 166. Similarly, phase $\phi2d$ is delayed from $\phi2$ by the delay of inverters 172 and 174. It should be understood that clock generator 160 is just one of many possible embodiment clock generators. In alternative embodiments, other topologies, logically equivalent or otherwise, may be used. In an embodiment, $\phi$chop may be generated, for example, using a clock divider having an input coupled to $\phi1$.

Figure 2A:
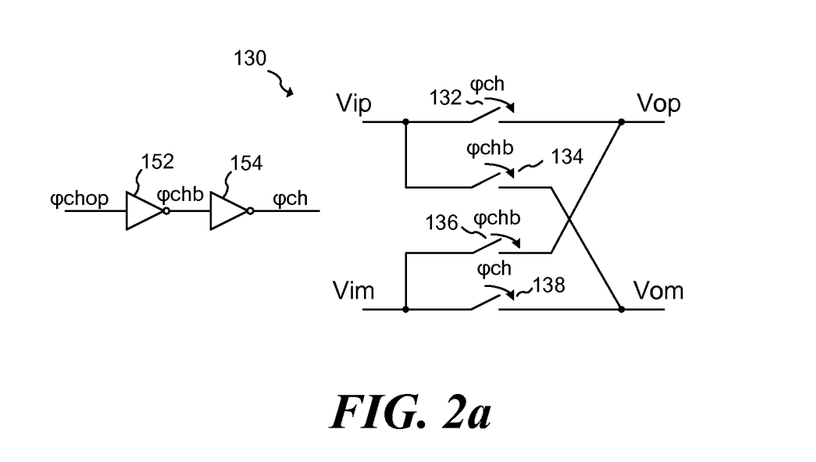
FIGS. 2a-b illustrate schematics of an embodiment chopper and its associated switches.

FIG. 2a illustrates embodiment chopping circuit 130 that may be used, for example, for chopping circuits 104, 106, 108 and 110 shown in FIG. 1a. In an embodiment, chopping circuit 130 includes non-inverting signal path switches 132 and 138, and inverting signal path switches 134 and 138. In an embodiment, non-inverting signal path switches 132 and 138 are closed when $\phi$ch is active, and inverting signal path switches 134 and 136 are active when $\phi$chb is active. In an embodiment, $\phi$ch and $\phi$chb are generated using inverters 152 and 154. Alternatively, $\phi$ch and $\phi$chb may be generated using different logic. In some embodiments, inverters 152 and 154 may be present in each chopper cell, while in other embodiments, $\phi$ch and $\phi$chb may be generated globally or for multiple chopper cells.

Figure 2B:
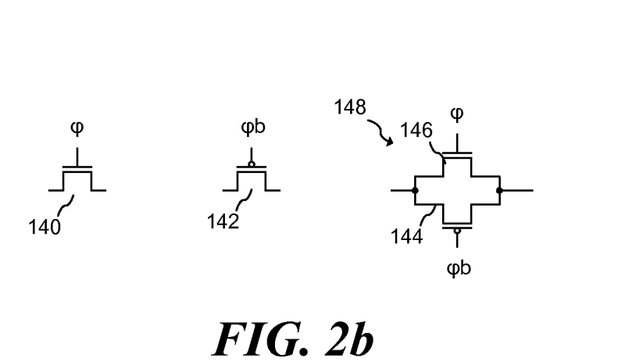

In embodiments in which are implemented using CMOS processes, switches may be implemented using NMOS devices 140, PMOS devices 142 and/or CMOS transmission gates 148 made of NMOS device 146 and PMOS device 148. Alternatively, other switch structures may be used in other embodiments that utilize, for example, other process types.

Figure 3:
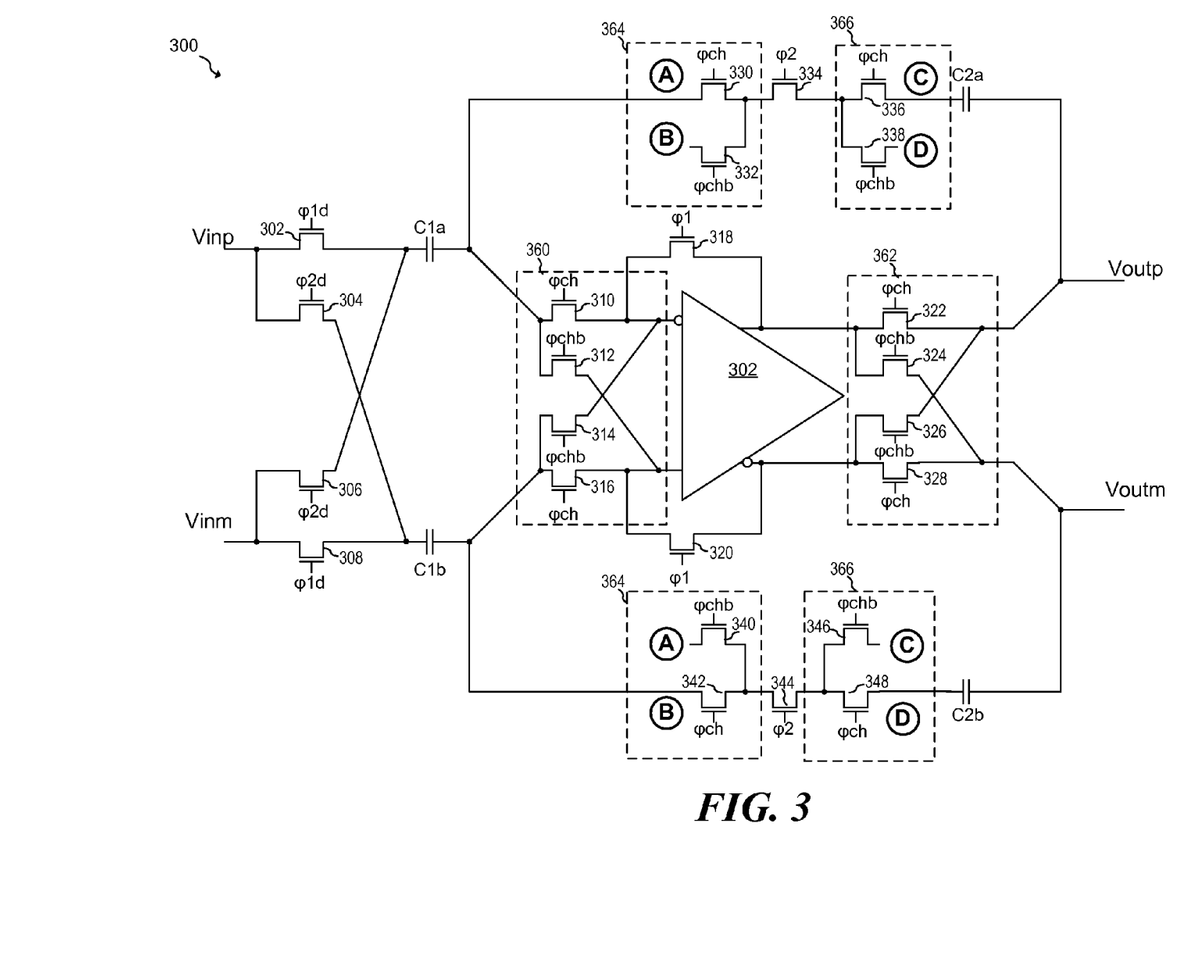
FIG. 3 illustrates a further embodiment switched capacitor integrator.

FIG. 3 illustrates an embodiment switched capacitor integrator 300 in which switches are implemented using NMOS transistors. Here, the input switching network is implemented using NMOS devices 302 and 308 in the non-inverting path and NMOS device 304 and 306 in the inverting path. A chopper stabilized auto-zeroing amplifier is implemented using fully differential amplifier 302 and NMOS devices 318 and 320 acting as auto-zeroing switches. First chopper 360 at the input of amplifier 302 is implemented using NMOS devices 310, 312, 314 and 316, and second chopper 362 is implemented using NMOS devices 322, 324, 326 and 328. In the feedback path, capacitors C2a and C2b act as integrating capacitors and NMOS devices 334 and 344 function as feedback capacitor switches. Feedback switches 334 and 344 are coupled between third chopper 364 made of NMOS devices 330 and 342 in the non-inverting path and NMOS devices 332 and 340 in the inverting path; and to fourth chopper 366 made of NMOS devices 336 and 348 in the non-inverting path and NMOS devices 338 and 346 in the inverting path.

In an embodiment, the operation of switched capacitor integrator 300 starts when auto-zeroing switches 318 and 320 are closed via φ1, thereby placing amplifier 302 in a unity gain feedback configuration. At this point, the offset of amplifier 302 is sampled on capacitors C1a and C1b. A short time later, input switches 302 and 308 are closed when φ1d asserted, thereby coupling Vinp to input capacitor C1a and Vinm to input capacitor C1b. Next, auto-zeroing switches 318 and 320 are opened when φ1 becomes de-asserted. Any residual error charge injected into capacitors C1a and C1b at this point is compensated by the first and second chopping circuits coupled to the input and output of amplifier 302. A short time later, switches 302 and 308 are open, however, any charge injected by these switches is absorbed by the source, since the opposite end of C1a and C1b with respect to the input switching network sees a high impedance.

Next, feedback switches 334 and 344 are closed, thereby coupling feedback capacitors C2a and C2b to the input of amplifier 302 via first chopping circuit 360. At this point in time, charge injected from switches 334 and 344 are stored on capacitors C2a and C2b. Any error caused by this charge injection is compensated by third and fourth chopper circuits 364 and 366 coupled to feedback switches 334 and 344. A short time later, input switches 304 and 306 are activated, which allows charge to be redistributed between capacitors C1a and C2a and between capacitors C2a and C2b. When feedback switches 334 and 344 open, charge may be injected into capacitors C1a, C1b, C2a and C2b, however, charge injection error arising from this charge injected is compensated by third and fourth chopping circuits 364 and 366 coupled to either side of feedback switches 334 and 344.

In an embodiment, the state of first, second, third and fourth chopping circuits 360, 362, 364 and 366 are controlled by phases φch and φchb that change state during first phase φ1, which corresponds with the phase during which amplifier 302 is auto-zeroed. Here, charge injected by switches 330, 332, 310, 312, 316, 340 and 342 are absorbed by the virtual ground present at the inputs of amplifier 302; and charge injected by devices 322, 324, 326 and 328 is absorbed by the output of amplifier 302. Change injected by devices 336, 338, 346 and 348 is compensated at a first order because device pairs are coupled to opposite phases. For example, charge injected by devices 336 and 348 are compensated by charge injected by devices 338 and 346 in an opposite direction. Residual charge injected by devices 336, 338, 346 and 348 due to mismatch between these devices is further mitigated by the fact that the chopping frequency is less than the frequency of φ1 and φ2.

Embodiment switched capacitor circuits may be implemented on a silicon substrate using a CMOS process. Capacitors may be implemented using a variety of different capacitor structures including, but not limited to poly-poly capacitors, MOS capacitors, metal-metal capacitors, sandwich capacitors.

In accordance with an embodiment, a circuit includes a forward path circuit that has an amplifier, an auto-zero switch coupled between an input of the amplifier and an output of the amplifier, a first chopping circuit having an input coupled to an input of the forward path circuit and an output coupled to the input of the amplifier, and a second chopping circuit having an input coupled to the output of the amplifier and an output coupled to an output of the forward path circuit. The circuit further includes a feedback circuit that has a feedback switch, a feedback capacitor including a first end coupled to an output of the amplifier, a third chopping circuit coupled between the input of the forward path circuit and a first end of the feedback switch, and a fourth chopping circuit coupled between a second end of the feedback switch and a second end of the feedback capacitor. In an embodiment, the forward path, the feedback circuit, and the input circuit are disposed on an integrated circuit.

In an embodiment, the circuit further includes an input circuit that has an input capacitor comprising a first and a second end, where the second end coupled to the input of the forward path circuit. The circuit also includes a first input switch coupled between a first input node and the first end of the input capacitor, and a second input switch coupled between a second input node and the first end of the input capacitor. In some embodiments, the first input switch and the auto-zero switch is coupled to a first clock phase signal, the second input switch and the feedback switch are coupled to a second clock phase signal, and the first, second, third and fourth chopping circuits are coupled to a third clock phase signal. A first delay circuit may be coupled between the first clock phase signal and the first input switch, a second delay circuit may be coupled between the second clock phase signal and the second input switch.

In some embodiments, the circuit also includes a clock phase generator configured to produce the first clock phase and the second clock phase, such that the first clock phase and the second clock phases are non-overlapping clock phases. In an embodiment, the third clock phase signal is configured to be asserted during a first pulse of the first clock phase signal, and de-asserted during a subsequent pulse of the first clock phase signal. The first and second clock phase signals may operate at a first frequency, and the third clock phase signal may operate at a second clock frequency, such that the first clock frequency being greater than the second clock frequency.

In an embodiment, the forward path, the feedback circuit, and the input circuit include fully differential circuits. For example, the amplifier may include a differential amplifier, the auto-zero switch may include a plurality of switches, the feedback switch may include a plurality of switches, the first input switch my include a plurality of switches, and the second input switch may include a plurality of switches.

In accordance with a further embodiment, a switched capacitor integrator includes chopper stabilized auto-zeroing amplifier having a differential output coupled to a differential output of the switched capacitor integrator. The switched capacitor integrator also includes a chopper stabilized capacitive feedback network coupled between a differential input of the chopper stabilized auto-zeroing amplifier and the differential output of the chopper stabilized auto-zeroing amplifier, a plurality of series input capacitors having second ends coupled to the differential input of the chopper stabilized amplifier, and an input switching network coupled between a differential input of the switched capacitor integrator and first ends of the plurality of series input capacitors.

In an embodiment, the chopper stabilized auto-zeroing amplifier includes a first switch coupled between a first input of a differential amplifier and a first output of the differential amplifier, a second switch coupled between a second input of the differential amplifier a second output of the differential amplifier, a first chopper circuit coupled between the differential input of the chopper stabilized amplifier and the first input and second input of the differential amplifier, a second chopper circuit coupled between the output differential output of the chopper stabilized amplifier and the first output and the second output of the differential amplifier. The chopper stabilized capacitive feedback network includes a third chopper circuit coupled to a fourth chopper circuit via a plurality of feedback switches, and a plurality of feedback capacitors coupled between the fourth chopper circuit and the differential output of the switched capacitor integrator. The input switching network includes a first plurality of switches defining a non-inverting path, and a second plurality of switches defining an inverting path.

In an embodiment, the first and second switches of the chopper stabilized auto-zeroing amplifier, and the first plurality of switches of the input switching network are coupled to a first clock phase signal. The plurality of feedback switches and the second plurality of switches of the input switching network are coupled to a second clock phase signal, and the first, second, and third chopping circuits are coupled to a third clock phase signal.

In an embodiment the first clock phase signal and the second clock phase signals are configured to be non-overlapping clock phase signals, the third clock phase signal is configured to be asserted during a first pulse of the first clock phase signal, and the third clock phase signal is configured to be de-asserted during a subsequent pulse of the first clock phase signal. The first and second clock phase signals may operate at a first frequency, and the third clock phase signal may operate at a second clock frequency, where the first clock frequency is greater than the second clock frequency.

In an embodiment, the first, second, third and fourth chopper circuits each include a first plurality of chopper switches defining a non-inverting path, and a second plurality of chopper switches defining an inverting path. In some embodiments, the first plurality of chopper switches, the second plurality of chopper switches, the first switch, the second switch, and the plurality of feedback switches are implemented with MOS transistors.

In accordance with another embodiment, a method of operating a switched capacitor integrator includes auto-zeroing an amplifier by sampling a first polarity of a differential input voltage and an amplifier offset on a plurality input capacitors coupled a differential input of the amplifier. After auto-zeroing the amplifier, a plurality of feedback capacitors are coupled between the differential input of the amplifier and a differential output of the amplifier using a plurality of feedback switches, and a second polarity of the differential input voltage is applied to the plurality of input capacitors. The method further includes chopping the amplifier using a first pair of chopping circuits, and chopping the feedback switches using a second pair of chopping circuits.

In an embodiment, chopping the amplifier includes reducing offset caused by charge injected from auto-zeroing switches of the amplifier to the plurality of input capacitors, and chopping the feedback switches includes reducing offset caused y charge injected from the feedback switches to the feedback capacitors. The step of sampling the first polarity of the differential voltage may include opening an amplifier auto-zeroing switch before opening an input coupling switch that is coupled to the plurality of input capacitors.

Advantages of embodiment systems and methods include the ability to implement a very high-resolution quasi-DC converter that is insensitive to component offset, flicker noise and thermal noise. Accordingly, smaller device sizes, lower currents, and smaller capacitors may be used when implementing embodiment circuits.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a forward path circuit comprising
      an amplifier,
      an auto-zero switch coupled between an input of the amplifier and an output of the amplifier,
      a first chopping circuit having an input coupled to an input of the forward path circuit and an output coupled to the input of the amplifier,
      a second chopping circuit having an input coupled to the output of the amplifier and an output coupled to an output of the forward path circuit,
   a feedback circuit comprising
      a feedback switch,
      a feedback capacitor comprising a first end coupled to an output of the amplifier
      a third chopping circuit coupled between the input of the forward path circuit and a first end of the feedback switch,
      a fourth chopping circuit coupled between a second end of the feedback switch and a second end of the feedback capacitor.

2. The circuit of claim 1, further comprising an input circuit, the input circuit comprising:
   an input capacitor comprising a first and a second end, the second end coupled to the input of the forward path circuit;
   a first input switch coupled between a first input node and the first end of the input capacitor; and
   a second input switch coupled between a second input node and the first end of the input capacitor.

3. The circuit of claim 2, wherein:
   the first input switch and the auto-zero switch is coupled to a first clock phase signal;
   the second input switch and the feedback switch are coupled to a second clock phase signal; and
   the first, second, third and fourth chopping circuits are coupled to a third clock phase signal.

4. The circuit of claim 3, further comprising:
   a first delay circuit coupled between the first clock phase signal and the first input switch; and
   a second delay circuit coupled between the second clock phase signal and the second input switch.

5. The circuit of claim 3, further comprising a clock phase generator configured to produce the first clock phase and the second clock phase, the first clock phase and the second clock phases being non-overlapping clock phases.

6. The circuit of claim 3, wherein:
   the first clock phase signal and the second clock phase signals are configured to be non-overlapping clock phase signals;

the third clock phase signal is configured to be asserted during a first pulse of the first clock phase signal; and the third clock phase signal is configured to be de-asserted during a subsequent pulse of the first clock phase signal.

7. The circuit of claim 6, wherein the first and second clock phase signals operate at a first frequency, and the third clock phase signal operates at a second clock frequency, the first clock frequency being greater than the second clock frequency.

8. The circuit of claim 2, wherein the forward path, the feedback circuit, and the input circuit comprise fully differential circuits, wherein
the amplifier comprises a differential amplifier;
the auto-zero switch comprises a plurality of switches;
the feedback switch comprises a plurality of switches;
the first input switch comprises a plurality of switches; and
the second input switch comprises a plurality of switches.

9. The circuit of claim 2, wherein the forward path, the feedback circuit, and the input circuit are disposed on an integrated circuit.

10. A switched capacitor integrator comprising:
a chopper stabilized auto-zeroing amplifier comprising a differential output coupled to a differential output of the switched capacitor integrator;
a chopper stabilized capacitive feedback network coupled between a differential input of the chopper stabilized auto-zeroing amplifier and the differential output of the chopper stabilized auto-zeroing amplifier;
a plurality of series input capacitors having second ends coupled to the differential input of the chopper stabilized amplifier; and
an input switching network coupled between a differential input of the switched capacitor integrator and first ends of the plurality of series input capacitors.

11. The switched capacitor integrator of claim 10, wherein:
the chopper stabilized auto-zeroing amplifier comprises a first switch coupled between a first input of a differential amplifier and a first output of the differential amplifier, a second switch coupled between a second input of the differential amplifier a second output of the differential amplifier, a first chopper circuit coupled between the differential input of the chopper stabilized amplifier and the first input and second input of the differential amplifier, a second chopper circuit coupled between the output differential output of the chopper stabilized amplifier and the first output and the second output of the differential amplifier;
the chopper stabilized capacitive feedback network comprises a third chopper circuit coupled to a fourth chopper circuit via a plurality of feedback switches, and a plurality of feedback capacitors coupled between the fourth chopper circuit and the differential output of the switched capacitor integrator; and
the input switching network comprises a first plurality of switches defining a non-inverting path, and a second plurality of switches defining an inverting path.

12. The switched capacitor integrator of claim 11, wherein:
the first and second switches of the chopper stabilized auto-zeroing amplifier, and the first plurality of switches of the input switching network are coupled to a first clock phase signal;
the plurality of feedback switches and the second plurality of switches of the input switching network are coupled to a second clock phase signal; and
the first, second, and third chopping circuits are coupled to a third clock phase signal.

13. The switched capacitor integrator of claim 12, wherein:
the first clock phase signal and the second clock phase signals are configured to be non-overlapping clock phase signals;
the third clock phase signal is configured to be asserted during a first pulse of the first clock phase signal; and
the third clock phase signal is configured to be de-asserted during a subsequent pulse of the first clock phase signal.

14. The switched capacitor integrator of claim 12,
wherein the first and second clock phase signals operate at a first frequency, and the third clock phase signal operates at a second clock frequency, the first clock frequency being greater than the second clock frequency.

15. The switched capacitor integrator of claim 11, wherein the first, second, third and fourth chopper circuits each comprise a first plurality of chopper switches defining a non-inverting path, and a second plurality of chopper switches defining an inverting path.

16. The switched capacitor integrator of claim 15, wherein the first plurality of chopper switches, the second plurality of chopper switches, the first switch, the second switch, and the plurality of feedback switches comprise MOS transistors.

17. A method of operating a switched capacitor integrator comprising:
auto-zeroing an amplifier, auto-zeroing comprising sampling a first polarity of a differential input voltage and an amplifier offset on a plurality input capacitors coupled a differential input of the amplifier;
after auto-zeroing the amplifier, coupling a plurality of feedback capacitors between the differential input of the amplifier and a differential output of the amplifier using a plurality of feedback switches, and applying a second polarity of the differential input voltage to the plurality of input capacitors;
chopping the amplifier using a first pair of chopping circuits; and
chopping the feedback switches using a second pair of chopping circuits.

18. The method of claim 17, wherein:
chopping the amplifier comprises reducing offset caused by charge injected from auto-zeroing switches of the amplifier to the plurality of input capacitors; and
chopping the feedback switches comprises reducing offset caused y charge injected from the feedback switches to the feedback capacitors.

19. The method of claim 17, wherein sampling the first polarity of the differential voltage comprises opening an amplifier auto-zeroing switch before opening an input coupling switch that is coupled to the plurality of input capacitors.

* * * * *

UNITED STATES PATENT AND TRADEMARK OFFICE
CERTIFICATE OF CORRECTION

| | | |
|---|---|---|
| PATENT NO. | : 8,604,861 B1 | Page 1 of 1 |
| APPLICATION NO. | : 13/527193 | |
| DATED | : December 10, 2013 | |
| INVENTOR(S) | : Ceballos et al. | |

It is certified that error appears in the above-identified patent and that said Letters Patent is hereby corrected as shown below:

In the Claims

Col. 10, line 51, claim 18, delete "caused y" and insert --caused by--.

Signed and Sealed this
Twenty-ninth Day of April, 2014

Michelle K. Lee
*Deputy Director of the United States Patent and Trademark Office*